United States Patent
Vopat et al.

(10) Patent No.: US 9,669,552 B2
(45) Date of Patent: Jun. 6, 2017

(54) SYSTEM AND METHOD FOR QUICK-SWAP OF MULTIPLE SUBSTRATES

(71) Applicant: Varian Semiconductor Equipment Associates, Inc., Gloucester, MA (US)

(72) Inventors: Robert Brent Vopat, Austin, TX (US); Jason M. Schaller, Austin, TX (US); William Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 673 days.

(21) Appl. No.: 13/898,019

(22) Filed: May 20, 2013

(65) Prior Publication Data

US 2014/0341700 A1 Nov. 20, 2014

(51) Int. Cl.
- *H01L 21/677* (2006.01)
- *B25J 15/00* (2006.01)
- *H01L 21/67* (2006.01)
- *B25J 11/00* (2006.01)

(52) U.S. Cl.
CPC ....... *B25J 15/0052* (2013.01); *B25J 11/0095* (2013.01); *H01L 21/67201* (2013.01); *H01L 21/67742* (2013.01); *H01L 21/67757* (2013.01)

(58) Field of Classification Search
CPC ......... H01L 21/67751; H01L 21/67757; H01L 21/67201; B25J 15/0052
USPC ...................................................... 901/40, 17
See application file for complete search history.

(56) References Cited

U.S. PATENT DOCUMENTS

| | | | | |
|---|---|---|---|---|
| 3,973,665 A | * | 8/1976 | Giammanco | B23Q 7/003 118/733 |
| 4,781,517 A | * | 11/1988 | Pearce | B23P 19/04 104/167 |
| 5,387,068 A | * | 2/1995 | Pearson | B25J 15/0616 294/65 |
| 5,804,507 A | | 9/1998 | Perlov et al. | |

(Continued)

FOREIGN PATENT DOCUMENTS

| | | |
|---|---|---|
| KR | 20-0331986 Y1 | 11/2003 |
| WO | 97-26117 A1 | 7/1997 |
| WO | 2005-038094 A2 | 4/2005 |

OTHER PUBLICATIONS

Schaller, Jason, et al., Venturi Assisted Gripper, U.S. Appl. No. 13/451,598, filed Apr. 20, 2012.

(Continued)

*Primary Examiner* — Jonathan Snelting (57) ABSTRACT

A system and method are disclosed for substrate handling. The system can include a robot adapter configured to connect to a robot, and first and second end effectors connected to the robot adapter. The robot adapter is configured to move the first and second end effectors from a first, retracted, position to a second, extended, position. In the extended position, the first or second end effector is disposed within a top entry load lock for picking or dropping a plurality of substrates therein. The first and second end effectors can be selectively and independently movable. The robot adapter can be rotatable so as to selectively position one of the end effectors over the top entry load lock. Methods for quickly swapping processed and unprocessed substrates in the top entry load lock are also disclosed and claimed.

14 Claims, 9 Drawing Sheets

(56) References Cited

U.S. PATENT DOCUMENTS

| | | | |
|---|---|---|---|
| 5,993,144 A * | 11/1999 | Inoue | B21D 43/18 294/65 |
| 6,439,631 B1 * | 8/2002 | Kress | B65G 47/918 294/65 |
| 6,725,532 B1 * | 4/2004 | Okada | H05K 13/0408 29/740 |
| 7,422,406 B2 * | 9/2008 | van der Meulen | B25J 9/042 414/217 |
| 8,051,741 B2 * | 11/2011 | Inoue | B25J 19/0025 74/490.01 |
| 8,430,620 B1 | 4/2013 | Blank | |
| 2012/0199065 A1 * | 8/2012 | Wieting | H01L 21/67173 118/704 |
| 2013/0108401 A1 | 5/2013 | Schaller et al. | |
| 2013/0108406 A1 | 5/2013 | Schaller et al. | |

OTHER PUBLICATIONS

Schaller, Jason, et al., Multi-Cell Rotary End Effector Mechanism, U.S. Appl. No. 13/468,134, filed May 10, 2012.
Blahnik, Jeffrey C., High Throughput, Low Volume Clamshell Load Lock, U.S. Appl. No. 13/803,430, filed Mar. 14, 2013.
International Search Report and Written Opinion mailed Sep. 16, 2014 for PCT application PCT/US2014/038452 filed May 16, 2014.

* cited by examiner

SYSTEM AND METHOD FOR QUICK-SWAP OF MULTIPLE SUBSTRATES

FIELD OF THE DISCLOSURE

The disclosure relates semiconductor processing methods in general, and more particularly to a system and method for swapping wafers into and out of a load lock as part of a semiconductor manufacturing process.

BACKGROUND OF THE DISCLOSURE

The processing of material such as semiconductor substrates involves the use of a variety of tools for performing various transfer and processing steps. Certain of the transfer and processing steps are performed in a vacuum chamber, while others are performed outside the vacuum chamber. As will be appreciated, throughput of the transfer and processing tools is an important factor in achieving low cost manufacture. Overall throughput is a function of both the processing time and the efficiency of automated substrate handling.

Automated substrate handling involves the movement of substrates from a substrate carrier to a processing station, and return of the substrates to the substrate carrier following processing. Various intermediate stations and transfer steps may be involved in this process. For example, substrate handling systems can include one or more load locks for transferring substrates to and from the vacuum chamber with minimal impact on the pressure level in the vacuum chamber. The substrate carrier may be a cassette, or a FOUP (Front Opening Unified Pod), which is a standardized carrier utilized for transporting substrates in fabrication facilities. Some of the processing and substrate handling operations may be performed concurrently to achieve efficient operation and high throughput. Accordingly, careful design of substrate handling systems is required.

Robots can be used outside of the vacuum chamber to transfer substrates from the FOUP or cassette to a load lock. Robots can be used inside the vacuum chamber to transfer the substrates from the load lock to a transfer station and/or a processing station. After the substrates have been processed, the robots reverse their actions so as to return processed substrates to the load lock. The load lock may then be vented and the substrates removed for storage.

All of the known substrate handling systems have one or more drawbacks, including but not limited to relatively low throughput, high cost and complex design. Accordingly, there is a need for improved methods and apparatus for transferring of substrates to and from a vacuum chamber.

SUMMARY OF THE DISCLOSURE

A substrate handling system is disclosed. The system may include a robot adapter configured to connect to a robot, and first and second end effectors connected to the robot adapter. The robot adapter can be configured to move the first and second end effectors from a first position to a second position. The first position can be a retracted position, and the second position can be an extended position in which the first or second end effector is positionable within a top entry load lock for engaging a plurality of substrates.

A substrate handling system is disclosed. The substrate handling system can include a robot adapter for coupling to a robot, first and second end effectors connected to the robot adapter, and a top entry load lock coupled to a processing chamber. The robot adapter can be configured to move the first and second end effectors from a first position to a second position. The first position can be a retracted position, and the second position can be an extended position in which the first or second end effector is positionable within the top entry load lock to engage a plurality of substrates disposed in the top entry load lock.

A method is disclosed for handling a plurality of substrates. The method may comprise: positioning a robot attachment coupled to first and second end effectors adjacent to a top entry load lock, the first end effector engaged with a plurality of unprocessed substrates; moving the second end effector into the top entry load lock and picking a plurality of processed substrates from the top entry load lock; moving the robot attachment to position the first end effector over the top entry load lock; and moving the first end effector into the top entry load lock and placing the plurality of unprocessed substrates in the top entry load lock.

DETAILED DESCRIPTION

A substrate handling system will now be described more fully hereinafter with reference to the accompanying drawings, in which preferred embodiments of the invention are shown. It will be appreciated that the disclosed substrate handling system may be embodied in many different forms and should not be construed as being limited to the embodiments set forth herein. Rather, these embodiments are provided so that this disclosure will be thorough and complete, and will fully convey the scope of the invention to those skilled in the art. In the drawings, like numbers refer to like elements throughout.

The figures illustrate an exemplary embodiment of a system in accordance with the present disclosure. For the sake of convenience and clarity, terms such as "front," "rear," "top," "bottom," "right," "left," "up," "down," "inwardly," "outwardly," "lateral" and "longitudinal" will be used herein to describe the relative placement and orientation of components of the system, each with respect to the geometry and orientation of the as it appears in the figures. This terminology will include the words specifically mentioned, derivatives thereof, and words of similar import.

A method and apparatus are disclosed for quick swap of a large matrix of solar cells or other substrates in a top entry loadlock. The design includes an end effector arrangement for a robot that is capable of quickly swapping a processed matrix of cells from a loadlock or station with an unprocessed matrix of cells using two similar end effectors coupled to a central automation component. The quick swap enables the robot to make each exchange without an intermediate exchange to put down or pickup cells from another station.

Figure 1:
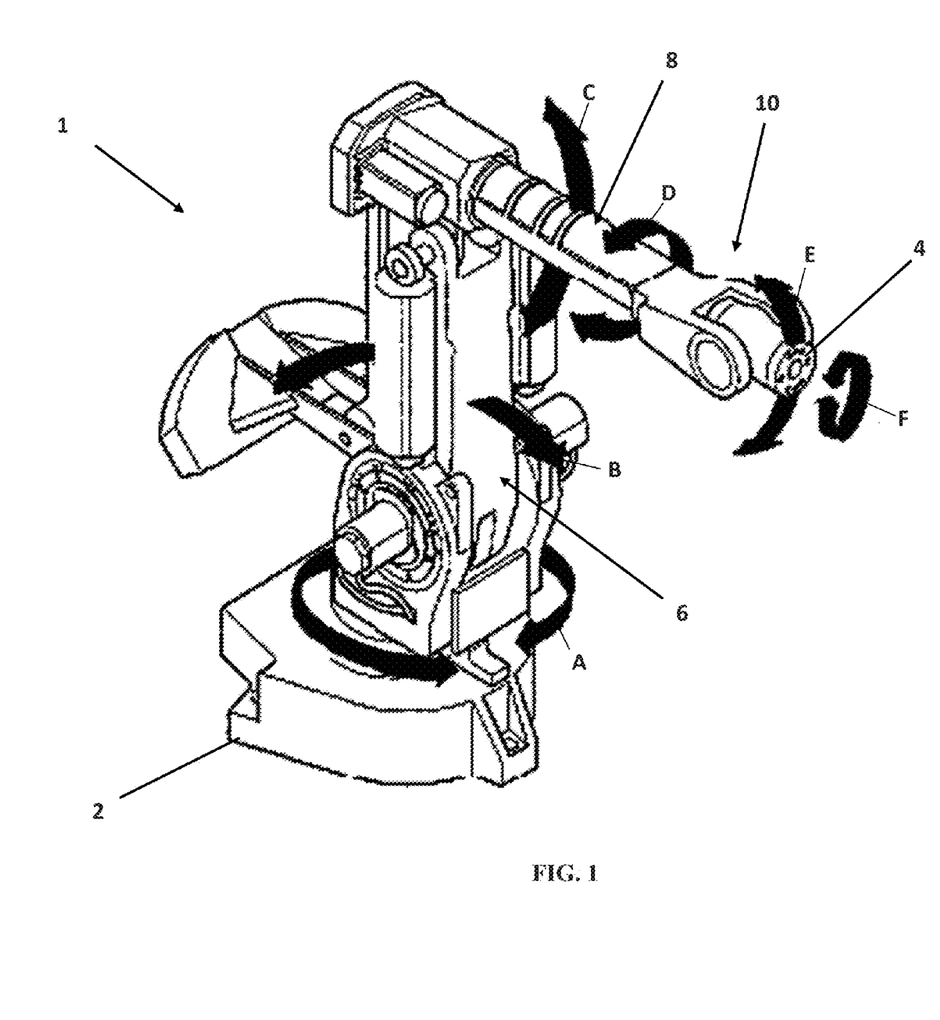
FIG. 1 is an isometric view of an exemplary robot having six degrees of freedom.

FIG. 1 shows an exemplary robot 1 for use with the disclosed system. In the illustrated embodiment 1 the robot 1 is a six-degree-of-freedom robot having rotational adjustability identified by arrows A-F. It will be appreciated that such adjustability is not critical, and that robots having fewer degrees of freedom may also be used. The robot 1 may have a base portion 2 at one end for fixedly engaging a floor of a substrate transfer station, and a tool interface 4 for coupling to an aspect of the disclosed system, as will be described in greater detail later. The robot 1 may have a plurality of arms 6, 8 and a wrist arrangement 10, of which the tool interface 4 is a part.

Figure 2:
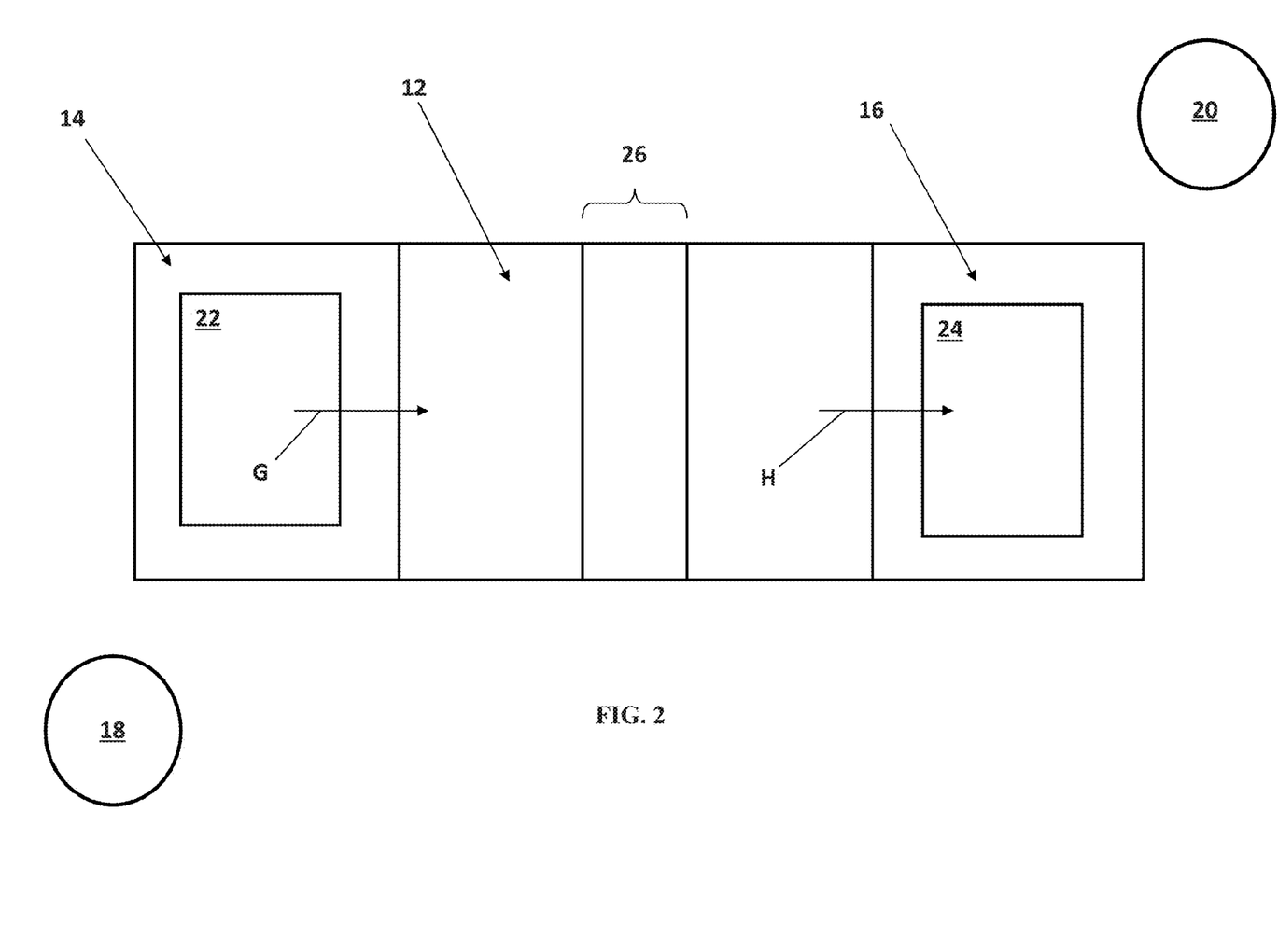
FIG. 2 is a schematic view of an exemplary substrate handling system according to the disclosure.

FIG. 2 is an exemplary arrangement of a processing chamber 12, having first and second load locks 14, 16 positioned on opposite lateral sides of the processing chamber 12. First and second robots 18, 20 are associated with respective ones of said first and second load locks 14, 16. In one embodiment, the first and second robots 18, 20 are six-degree-of-freedom robots similar to the robot 1 described in relation to FIG. 1. As will be appreciated, by positioning the first and second load locks 14, 16 on opposite lateral sides allows for a first substrate 22 (or set of substrates) to be moved into the processing chamber 12 along arrow "G" while a second substrate 24 is being moved out along arrow "H." This enhances the efficiency of the substrate transfer operation as compared to systems that utilize a single load lock for transferring substrates into and out of the processing chamber.

Thus arranged, the first robot 18 can transfer one or more first substrates 22 into the first load lock 14. The first load lock 14 can be pumped down to meet the vacuum conditions in the processing chamber 12. At the same time, the second substrate 24 can be undergoing processing in the processing chamber 12. In one non-limiting exemplary embodiment, the processing is an ion implant process in which the second substrate 24 is subjected to an ion beam in ion beam region 26 of the processing chamber 12. The processing chamber 12 may be connected directly to the first load lock 14 and second load lock 16 or may be connected indirectly by one or more other chambers. When processing of the second substrate 24 is complete, the second substrate may be moved in the direction of arrow "H" into the second load lock 16. The second load lock 16 may then be sealed from the processing chamber 12. At the same time, the first substrate 22 may be moved in the direction of arrow "G" into the processing chamber 12 where it can undergo processing (e.g., ion implantation) similar to that of the second substrate 24. While the first substrate 22 is undergoing processing, the second load lock 18 may be vented so that its internal atmosphere returns to ambient conditions. The second load lock 16 can then be opened so that the second robot 20 can pick the second substrate 24 from the second load lock to return the second substrate 24 to a FOUP or cassette. The second robot 20 may then pick another (unprocessed) substrate from a FOUP or cassette and transfer that substrate to the second load lock 16, where the process repeats.

It will be appreciated that this mutual action between the first and second robots 18, 20 and the first and second load locks 14, 16 enhances the efficiency of substrate processing and transfer operations as compared to prior systems.

Figure 3:
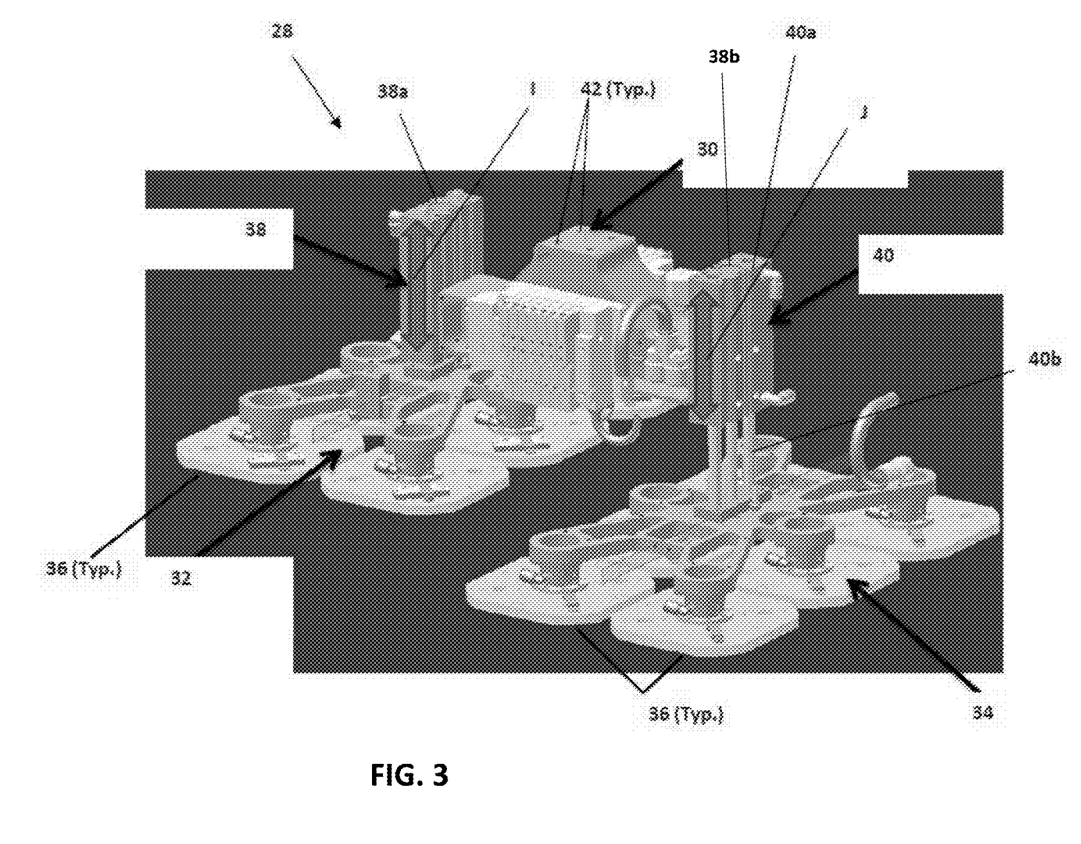
FIG. 3 is an isometric view of an exemplary robot adapter and end effector arrangement for use with the substrate handling system of FIG. 2.

Referring now to FIG. 3, an exemplary substrate engagement and manipulation system 28 is disclosed for use in achieving the substrate transfer sequence described in relation to FIG. 2. Each of the robots 18, 20 may be provided with such an engagement and manipulation system 28 to enable the robot to engage one or more substrates to move them between the load locks 14, 16 and one or more cassettes or FOUPs.

The exemplary substrate engagement and manipulation system 28 includes a robot adapter 30 for coupling to the tool interface 4 of the robot 1 (FIG. 1), and at least one end effector 32, 34 for engaging a plurality of substrates (such as the first and/or second substrates 22, 24 of FIG. 2) to transfer the substrates between a load lock (such as the first and/or second load lock 14, 16 of FIG. 2) and one or more cassettes or FOUPs. In some embodiments, one or more substrates from the cassette or FOUP are placed on a conveyor, and the robot 1 and associated end effector(s) 32, 34 can be used to pick the substrates off the conveyor to transfer them to the load lock. In the illustrated embodiment, the substrate engagement and manipulation system 28 includes first and second end effectors 32, 34.

The first and second end effectors 32, 34 can include any of a variety of types of gripping structures 36, a non-limiting list of which includes suction cups, Bernoulli and large area vacuum and venturi grippers. The gripping structures 36 can be individual components associated with individual substrates, or the gripping structures can be a single, larger component.

In some embodiments, the first and second end effectors 32, 34 are matrix end effectors capable of engaging and carrying multiple substrates at one time. As will be appreciated, carrying and holding larger matrixes of substrates allows for parallel processing of substrates by the processing equipment. In the illustrated embodiment, the end effectors 32, 34 are configured in a 2×3 matrix so that each end effector can engage and manipulate six (6) individual substrates. It will be appreciated, however, that other configurations are also contemplated, such as 4×4, 16×16, or the like. In some embodiments, each "pad" of the matrix may be capable of picking a single substrate, or each "pad" may be capable of picking multiple substrates at one time.

It will be appreciated that the disclosed substrate engagement and manipulation system 28 may find particular application with top entry loadlocks. Thus, the first and second end effectors 32, 34 are configured for dropping unprocessed substrates through the top of a load lock, and for picking processed substrates out vertically from the load lock. Of course, the disclosed substrate engagement and manipulation system 28 also may be used with conveyors belts, other robots, or other systems to transport substrates. The first and second end effectors 32, 34 may each be coupled to independently controllable first and second linear motion devices 38, 40 that enable the end effectors to be moved vertically with respect to the robot adapter 30. Specifically, the first and second linear motion devices 38, 40 allow the associated first and second end effectors 32, 34 to be moved in the direction of arrows "I" and "J." In the illustrated embodiment the linear motion devices 38, 40 are piston/cylinder arrangements in which the cylinder portion 38a, 40a is fixed to the robot adapter 30 and the piston portion 38b is fixed to the end effector 32, 34. As shown, the first linear motion device 38 is shown in a first position in which the piston portion 38b is fully retracted into the cylinder portion 38a. This first position may lift the first end effector 32 sufficiently to enable one or more substrates engaged by the first end effector to clear a sidewall 50, 52 (FIG. 5) of a top entry load lock 46. The second linear motion device 40 is shown in a second position so that the piston portion 40b is fully extended from the cylinder portion 40a. This second position may be sufficient to enable one or more substrates engaged by the second end effector 34 to drop the substrates onto pins, trays, pockets or other support surfaces of a top entry load lock. Both the first and second linear motion devices 38, 40 can be selectively configurable in the first position, the second position, or an intermediate position between the first and second positions.

The first and second linear motion devices 38, 40, can be controlled via a number of different technologies, including servomotors, hydraulic actuators, pneumatic actuators, and the like. The other system components, such as the robot 18, 20, robot adapter 30, and the first and second end effectors 32, 34 can also be controlled via one or more electrical, pneumatic and hydraulic actuation mechanisms.

Figure 4:
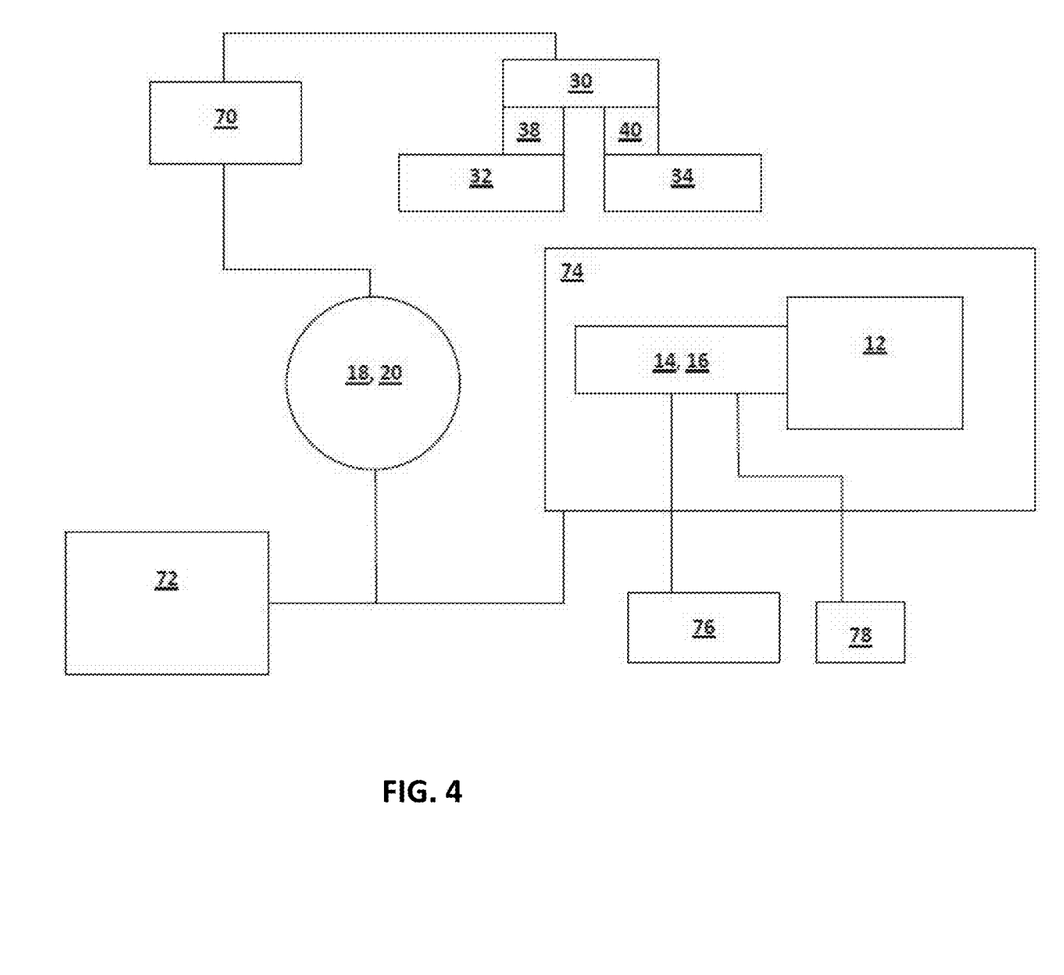
FIG. 4 is a schematic of a system for controlling the elements of the disclosed substrate handling system of FIG. 2.

FIG. 4 show an exemplary system control arrangement for the robot 18, 20, robot adapter 30, first and second linear motion devices 38, 40 and first and second end effectors 32, 34. The control arrangement includes a controller 70 coupled to the robot 18, 20 and the robot adapter 30 for controlling motions and actions of those components. In some embodiments, the controller 70 can also be directly or indirectly coupled to the first and second linear motion devices 38, 40 for controlling movement of the first and second end effectors 32, 34 between the first and second positions previously described. In other embodiments, the controller 70 can be coupled directly or indirectly to the first and second end effectors 32, 34 for controlling engagement/disengagement of one or more processed or unprocessed substrates 56. Hydraulic and/or pneumatic controls 72 can be coupled to the robot 18, 20 and the processing platform 74 which includes the first and second top entry load locks 14, 16 and the processing chamber 12. The hydraulic and/or pneumatic controls 72 can function to operate the hydraulic and/or pneumatic components of those respective system elements. Also shown are vent 76 and pump 78 connections to the top entry load locks 14, 16 and a pump 78 connection to the processing chamber 12 for controlling the vacuum conditions within those elements.

Referring again to FIG. 3, the robot adapter 30 is shown as including a plurality of fastener holes 42 for engaging the tool interface 4 of the robot 1. It will be appreciated, however, that the robot adapter 30 may be coupled to the tool interface 4 using any of a variety of connection schemes. In addition, it is contemplated that the robot adapter 30 may be a part of the robot 1.

As will be appreciated, the disclosed substrate engagement and manipulation system 28 may have features to allow the first and second end effectors 32, 34 to be passed over a side wall of the top entry load lock. Such features may include rotational movement and/or translational movement, as desired.

Figure 5:
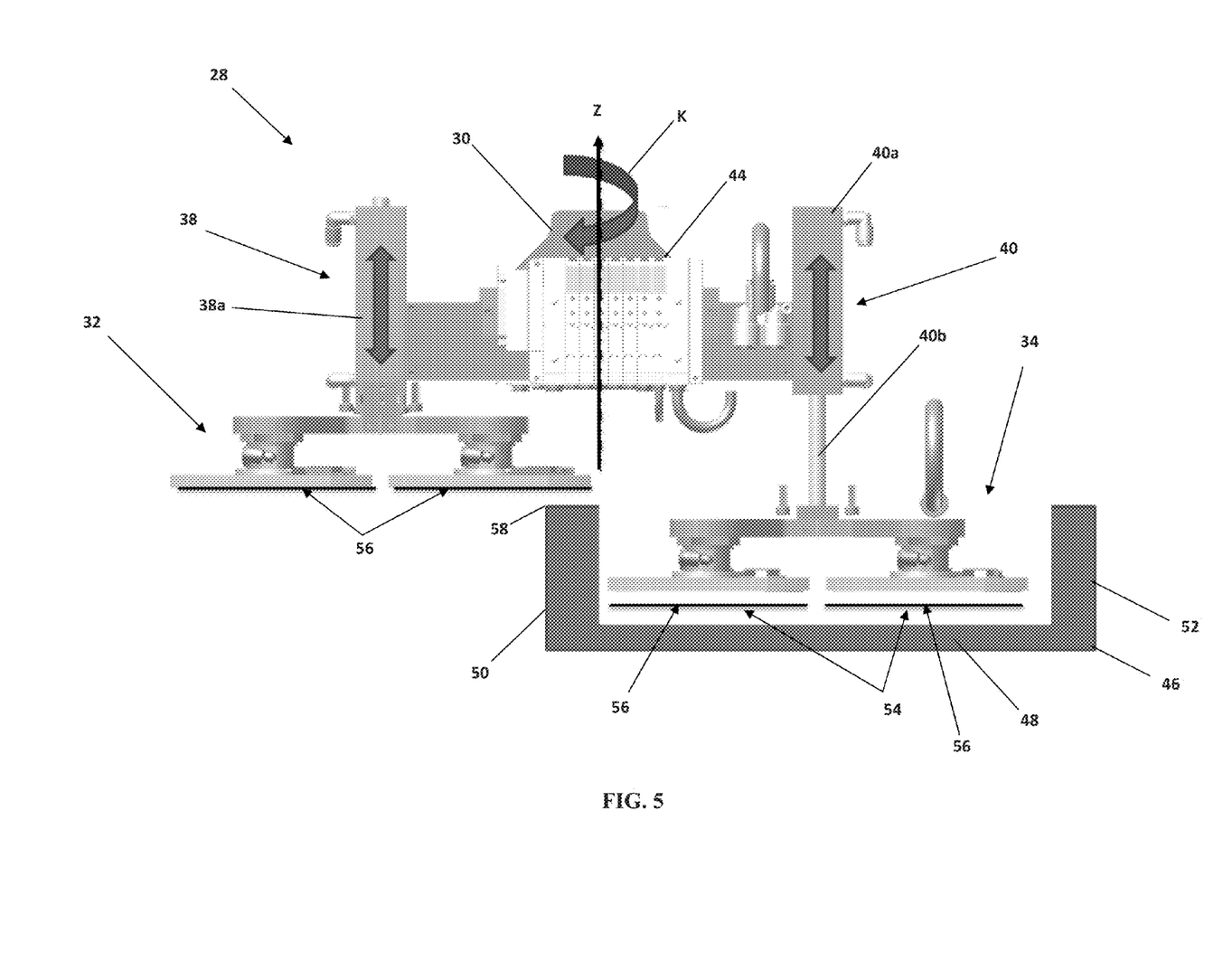
FIG. 5 is a side view illustrating an operation of the robot adapter and end effector of FIG. 3.

FIG. 5 shows an embodiment of the disclosed substrate engagement and manipulation system 28 in which the robot adapter 30 is configured for rotary motion to enable the first and second end effectors 32, 34 to be rotated into, and out of, engagement with a top loading load lock. Thus, the robot adapter 30 in this embodiment has a rotation feature 44 that enables the first and second end effectors 32, 34 to be rotated about the Z-axis (i.e., in the direction of arrow "K"). The rotation feature 44 can be any of a variety of arrangements suitable for imparting rotational motion to the robot adapter and first and second end effectors 32, 34. A non-limiting exemplary listing of such arrangements includes swivel assemblies, ring gears, and the like. The rotation feature 44 can be powered and/or controlled via a pneumatic, electric (e.g., servo motor), hydraulic or other control assembly disposed in or on the robot adapter.

FIG. 5 shows the disclosed substrate engagement and manipulation system 28 engaged with an exemplary top entry load lock 46. It will be appreciated that this top entry load lock 46 may be either the first or second load lock 14, 16 shown in FIG. 2. The top entry load lock 46 may include a bottom wall 48 and opposing sidewalls 50, 52. One or more substrate support elements 54 may be disposed on the bottom wall 48 or one or more of the sidewalls 50, 52. As previously noted, the substrate support elements 54 may comprise one or more pins, trays, pockets or the like. Not shown is a top wall which, once the substrates are positioned inside, may be used to seal the interior of the top entry load lock 46 from the surrounding environment so that it may be pumped down to meet the high vacuum conditions of the processing chamber 12.

In the position shown in FIG. 5, the second end effector 34 is configured in the second position so that it extends down into the top entry load lock 46 adjacent to a plurality of substrates 56 which are supported above the bottom wall 48 of the top entry load lock by substrate support elements 54. The first end effector 32 is configured in the first position, where the piston portion 38b of the first linear motion device 38 is fully retracted into the cylinder portion 38b so that it assumes the first position. The end effector 32 is supporting a plurality of substrates 56 at a level above the top surface 58 of the opposing sidewall 50 and is engaged first end effector is positioned in the "up" position engaged with substrates.

Thus arranged, the plurality of substrates 56 disposed in the top entry load lock 46 may be "processed" substrates, in that they may have been subjected to one or more processing steps within the processing chamber 12. The plurality of substrates engaged with the first end effector 32 may be "unprocessed" substrates, in that they have been picked from a cassette or FOUP and are ready to load into the top entry load lock 46. The engagement and manipulation system 28 may be configured to extend the second end effector 34 so that it assumes the second position, adjacent to, or in contact with, the plurality of substrates 56, as shown in FIG. 5. Once the second end effector 34 engages the plurality of substrates 56 (using gripping structures 36), the second linear motion device 40 may be actuated so that the piston portion 40b is retracted into the cylinder portion 40a, thus lifting the second end effector 34 and the attached processed substrates 56 up and out of the top entry load lock 46.

When the plurality of processed substrates 56 are lifted above the top surface 58 of the opposing sidewall 50, the rotation feature 44 of the robot adapter 30 may be actuated, rotating the first and second end effectors about axis Z (in the direction of arrow "K") so that the first end effector 32 and its attached unprocessed substrates 56 are positioned above the top entry load lock 46. The first linear motion device 38 may then be actuated so that the cylinder portion 38b extends outward from the cylinder portion 38, configuring the first linear motion device 38 from the first position to the second position. In the second position, the unprocessed substrates are adjacent to, or in contact with, the substrate supports 54 of the top entry load lock 46. The gripping structures 36 may then release the unprocessed substrates 56 so that the substrates are supported by the substrate supports 54 in the top entry load lock 46. The first linear motion device 38 may then be configured from the second position to the first position so that it retracts away from the substrates and the top entry load lock 46. The top wall (not shown) of the top entry load lock 46 may then be sealed to the opposing sidewalls 50, 52 and the interior volume pumped down so that the unprocessed substrates 56 can be translated into the processing chamber 12.

As will be appreciated, the FIG. 5 arrangement enables a "quick swap" of a plurality of unprocessed substrates 56 for a plurality of processed substrates, thus reducing transfer time and overall system throughput.

Figure 6:
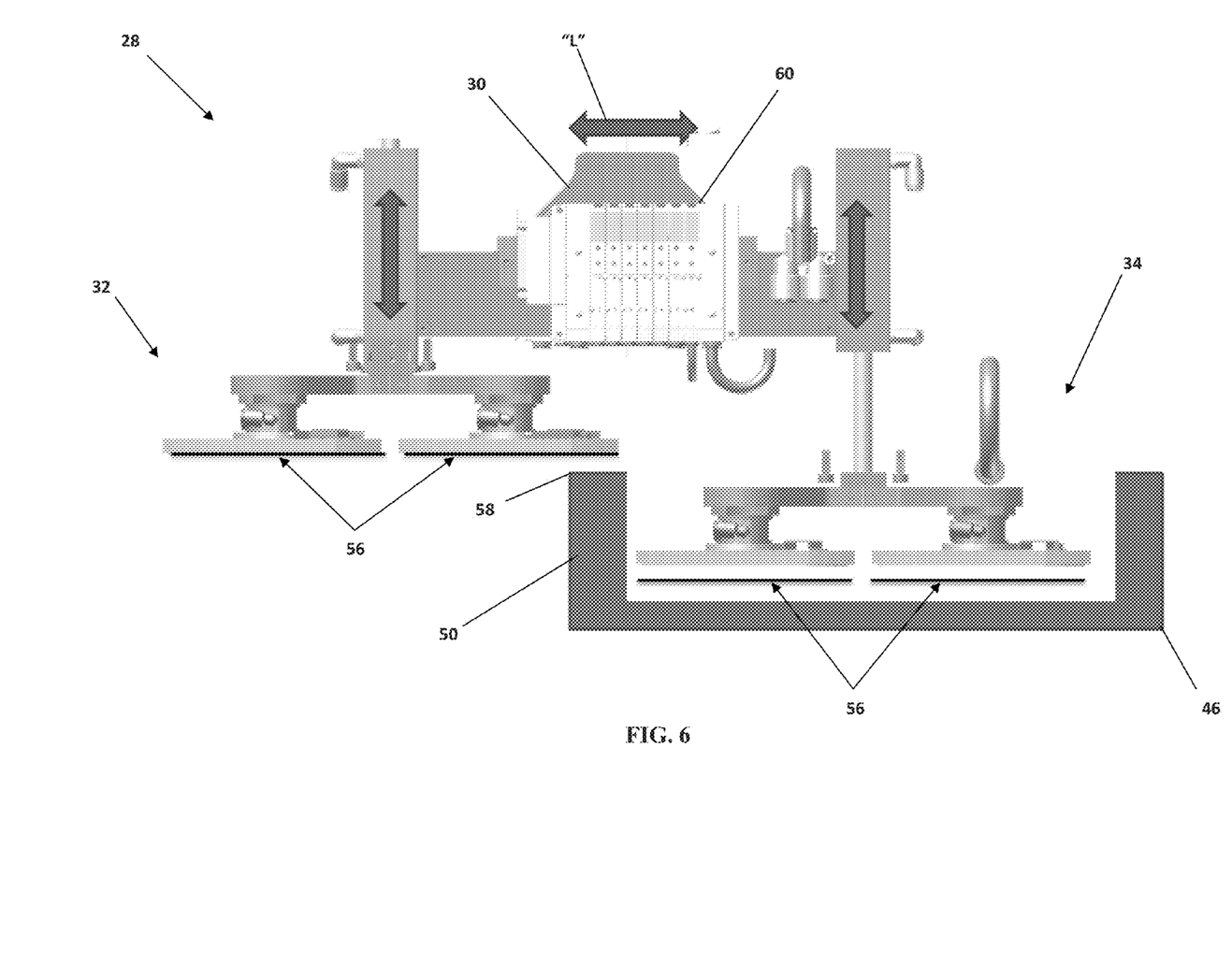
FIG. 6 is a side view illustrating another operation of the robot adapter and end effector of FIG. 3.

FIG. 6 shows an embodiment of disclosed substrate engagement and manipulation system 28 in which the robot adapter 30 is configured for linear motion to enable the first and second end effectors 32, 34 to translate toward, and away from, the top entry load lock 46. The operation of the first and second linear motion devices 38, 40 associated with the first and second end effectors 32, 34 are configured, and operate, in the same manner described in relation to FIG. 5. In the FIG. 6 embodiment, however, a third linear motion device 60 is substituted for the rotation feature of the robot adapter 30 to enable the substrate engagement and manipulation system 28 to translate in the "horizontal" direction (i.e., the direction identified by arrow "L," which is perpendicular to the Z-axis of FIG. 5). Thus, in the illustration, the first end effector 32 holds a plurality of unprocessed substrates 56, while the second end effector 34 is positioned adjacent to a plurality of processed substrates within the top entry load lock 46. The first end effector 32 is configured in the first position such that the piston portion 38*b* of the first linear motion device 38 is fully into the cylinder portion 38*a*. The second end effector 34 is configured in the second position such that the piston portion 40*b* is fully extended away from the cylinder portion 40*a*.

Once the second end effector 34 engages the plurality of processed substrates 56 in the top entry load lock 46, the second linear motion device 40 may be configured to the first position, drawing the substrates up and out of the top entry load lock. When the plurality of processed substrates 56 are lifted above the top surface 58 of the opposing sidewall 50, the third linear motion device 60 of the robot adapter 30 may be actuated, translating the first and second end effectors in the direction of arrow "L," so that the first end effector 32 and its attached unprocessed substrates 56 are positioned above the top entry load lock 46. The first linear motion device 38 may then be actuated so that the cylinder portion 38*b* extends outward from the cylinder portion 38, configuring the first linear motion device 38 from the first position to the second position. In the second position, the unprocessed substrates are adjacent to, or in contact with, the substrate supports 54 of the top entry load lock 46. The gripping structures 36 may then release the unprocessed substrates 56 so that the substrates are supported by the substrate supports 54 in the top entry load lock 46. The first linear motion device 38 may then be configured from the second position to the first position so that it retracts away from the substrates and the top entry load lock 46. The top wall (not shown) of the top entry load lock 46 may then be sealed to the opposing sidewalls 50, 52 and the interior volume pumped down so that the unprocessed substrates 56 can be translated into the processing chamber 12.

Figure 7:
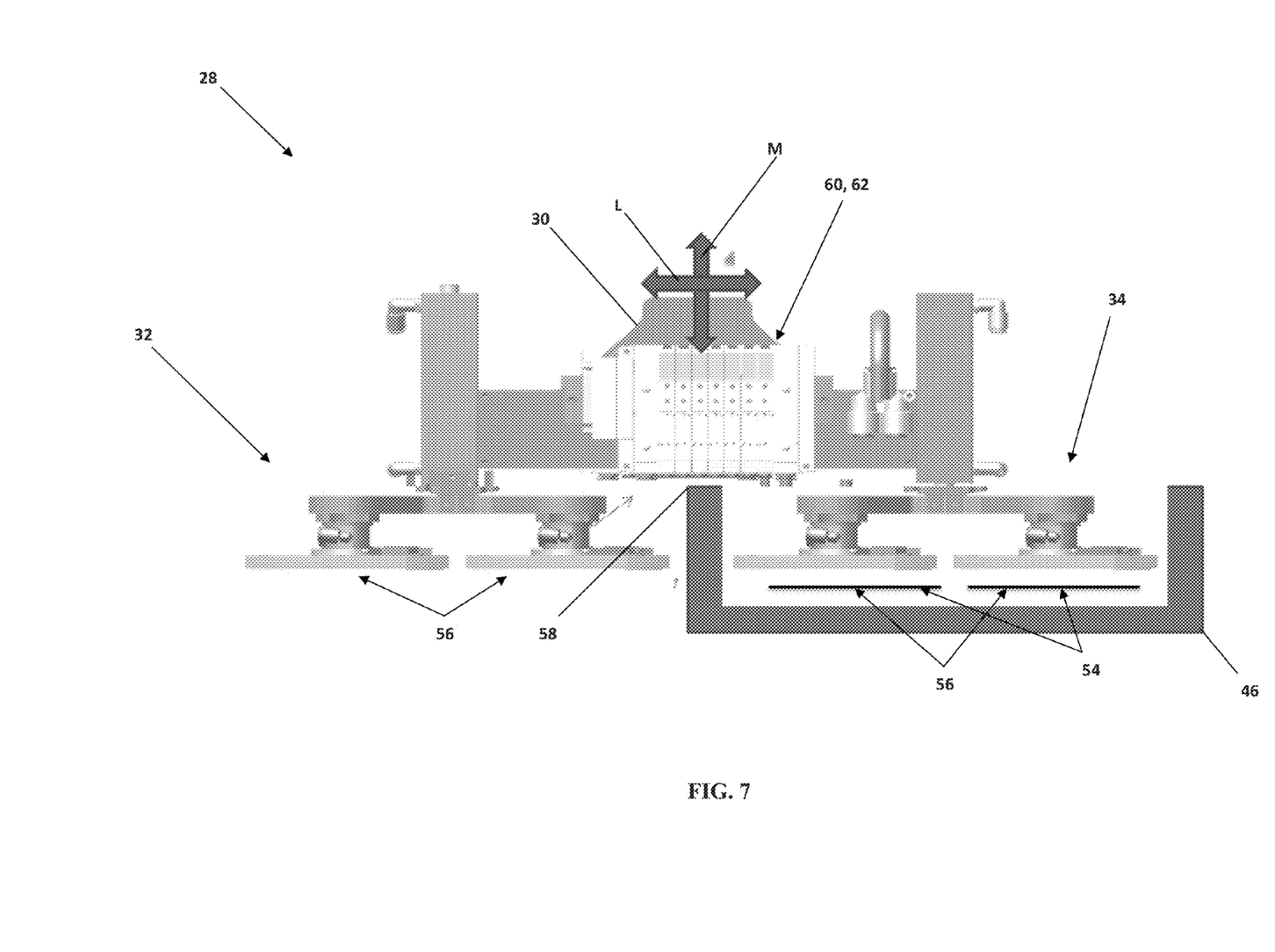
FIG. 7 is a side view illustrating a further operation of the robot adapter and end effector of FIG. 3.

FIG. 7 shows an embodiment of disclosed substrate engagement and manipulation system 28 in which the robot adapter 30 is configured for linear motion along two different axes to enable the first and second end effectors 32, 34 to translate toward, and away from, the top entry load lock 46, and to enable swapping of substrates as described in relation to prior embodiments. In the FIG. 7 embodiment, the robot adapter 30 includes third and fourth linear motion devices 60, 62. The third linear motion device 60 enables movement in a horizontal direction, identified by arrow "L," while the fourth linear motion device enables movement in a vertical direction, identified by arrow "M." Vertical movement along arrow "M" is substantially along the Z-axis of the substrate engagement and manipulation system 28, as shown in FIG. 5. With this embodiment, the first and second linear motion devices 38, 40 of the previous embodiments can be eliminated, and all desired motion for the first and second end effectors 32, 34 can be provided by the third and fourth linear motion devices 60, 62 of the robot adapter.

Thus, in the illustration, the first end effector 32 is positioned adjacent to a plurality of unprocessed substrates 56, while the second end effector 34 is positioned adjacent to a plurality of processed substrates within the top entry load lock 46. The fourth linear motion device 62 is configured in a second (i.e., extended) position such that the second end effector 34 is positioned within the top entry load lock 46 to engage the plurality of processed substrates 56. Once the second end effector 34 engages the plurality of processed substrates 56, the fourth linear motion device 62 may be configured to a first position, moving the first and second end effectors 32, 34 upward in the direction of arrow "M," drawing the processed substrates up and out of the top entry load lock 46. When the plurality of processed substrates 56 are lifted above the top surface 58 of the opposing sidewall 50, the third linear motion device 60 of the robot adapter 30 may be actuated, translating the first and second end effectors in the direction of arrow "L," so that the first end effector 32 and its attached unprocessed substrates 56 are positioned above the top entry load lock 46. The fourth linear motion device 62 may then be configured to the second (i.e., extended) position so that the unprocessed substrates are adjacent to, or in contact with, the substrate supports 54 of the top entry load lock 46. The gripping structures 36 may then release the unprocessed substrates 56 so that the substrates are supported by the substrate supports 54 in the top entry load lock 46. The fourth linear motion device 62 may then be configured from the second position to the first (i.e., retracted) position so that it retracts away from the substrates and the top entry load lock 46. The top wall (not shown) of the top entry load lock 46 may then be sealed to the opposing sidewalls 50, 52 and the interior volume pumped down so that the unprocessed substrates 56 can be translated into the processing chamber 12.

It will be appreciated that FIGS. 5-7 show discrete exemplary embodiments of a substrate engagement and manipulation system 28. It will be appreciated that different combinations of actuators (both rotational and translational) can be used to achieve a desired arrangement to allow quick swapping of unprocessed substrates for processed substrates in a top entry load lock.

Figure 8:
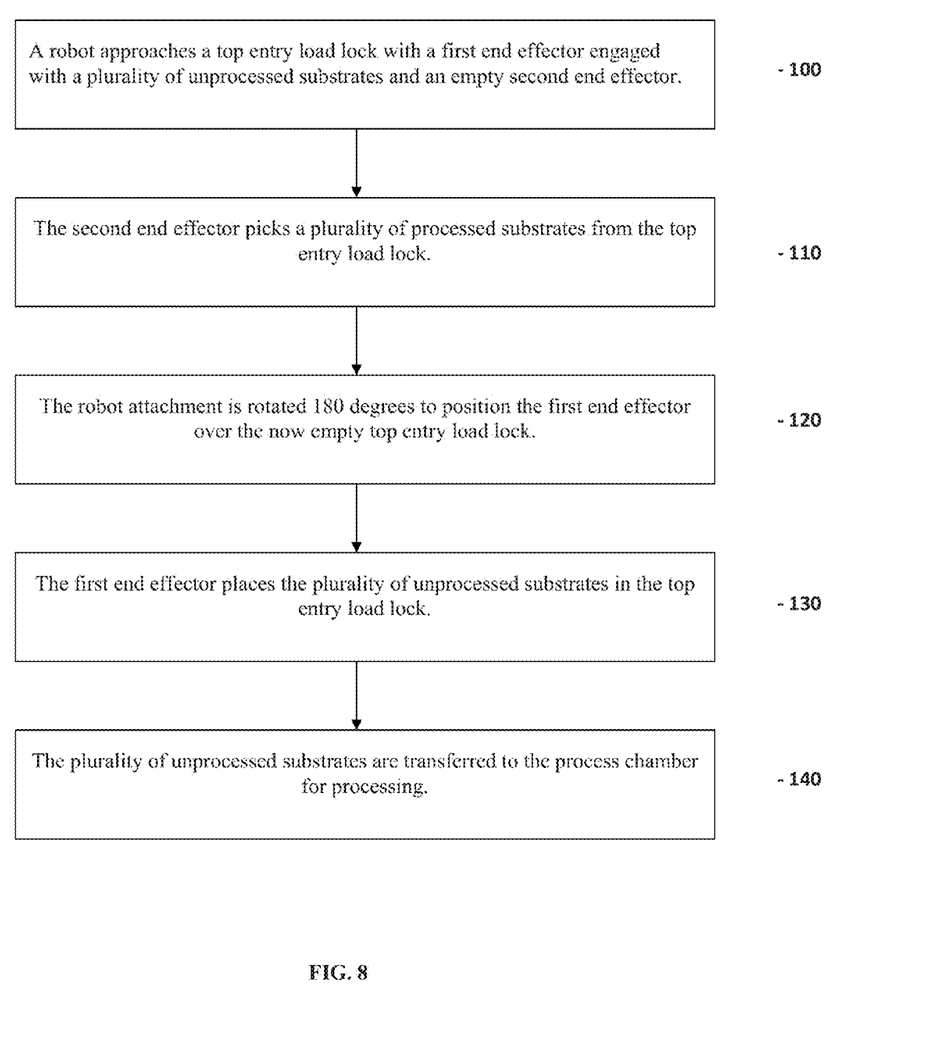
FIG. 8 is a flow chart illustrating an exemplary method according to the disclosure.

Referring now to FIG. 8, an exemplary method for quick swapping of a plurality of substrates will be described in greater detail. At step 100, the robot 1 approaches a top entry load lock 46 with a first end effector 32 engaged with a plurality of unprocessed substrates 56 and a second end effector 34. At step 110, the second end effector 34 picks a plurality of processed substrates 56 from the top entry load lock 46. At step 120, the robot attachment 30 is then rotated 180 degrees to position the first end effector 32 over the now empty top entry load lock 46. At step 130 the first end effector places the plurality of unprocessed substrates 56 in the top entry load lock 46. At step 140, the unprocessed plurality of substrates 56 are transferred to the process chamber 12 for processing.

Figure 9:
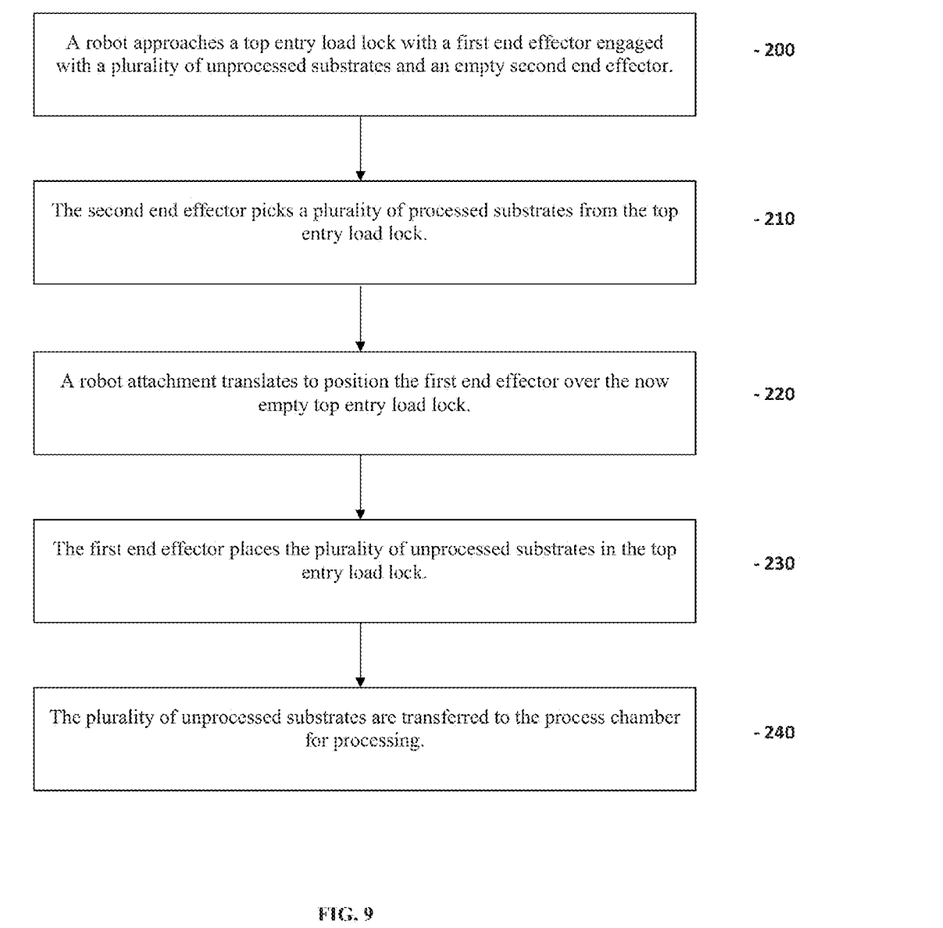
FIG. 9 is a flow chart illustrating an alternative exemplary method according to the disclosure.

FIG. 9 shows an alternative exemplary method for quick swapping of a plurality of substrates. At step 200, the robot 1 approaches a top entry load lock 46 with a first end effector 32 engaged with a plurality of unprocessed substrates 56 and a second end effector 34. At step 210, the second end effector 34 picks a plurality of processed substrates 56 from the top entry load lock 46. At step 220, the robot attachment 30 translates to position the first end effector 32 over the now empty top entry load lock 46. At step 230, the first end effector places the plurality of unprocessed substrates 56 in the top entry load lock 46. At step 240, the plurality of unprocessed substrates 56 are transferred to the process chamber 12 for processing.

The disclosed system is configured for handling a variety of substrates, which in an exemplary embodiment includes silicon wafers. It will be appreciated by those of ordinary skill in the art that this particular configuration is disclosed by way of example only, and that the below-described arrangement may be similarly implemented in virtually any type of substrate handling configuration. All such embodiments are contemplated and may be implemented without departing from the scope of the present disclosure.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The invention claimed is:

1. A substrate handling system, comprising:
a robot adapter configured to connect to a robot;
first and second end effectors connected to opposite ends of the robot adapter, wherein a tool interface of the robot is coupled to a top surface of the robot adapter, between the first and second end effectors;
wherein the robot adapter is configured to move the first and second end effectors from a first position to a second position, the first position comprising a retracted position, and the second position comprising an extended position in which the first or second end effector is positioned within a top entry load lock for engaging a plurality of substrates;
wherein the robot adapter includes a vertical linear motion device enabling vertical movement of the robot adaptor; and
a top entry load lock including opposing side walls, the top entry load lock coupled to a processing chamber;
wherein the robot adapter is centrally positioned directly over one of the opposing sidewalls, the robot adapter configured to move the first and second end effectors from a first position to a second position, the first position comprising a retracted position in which the first or second end effector is supported at a level above a top surface of one of the opposing sidewalls, and the second position comprising an extended position in which the first or second end effector is positionable within the top entry load lock to engage a plurality of substrates disposed in the top entry load lock.

2. The substrate handling system of claim 1, further comprising first and second linear motion devices coupled between the robot adapter and the first and second end effectors, respectively, the first and second linear motion devices being independently operable to selectively move the first and second end effectors between the first and second positions.

3. The substrate handling system of claim 2, the robot adapter further comprising a rotation feature for selectively rotating the first and second end effectors about a vertical axis extending through the robot adapter.

4. The substrate handling system of claim 2, the robot adapter further comprising a third linear motion device for translating the first and second end effectors along a horizontal axis, wherein the first and second linear motion devices are configured to move the first and second end effectors along a vertical axis.

5. The substrate handling system of claim 2, wherein the first and second linear motion devices each comprise a piston portion and a cylinder portion, wherein in the first position the piston portion is retracted within the cylinder portion and in the second position the piston portion is extended away from the cylinder portion.

6. The substrate handling system of claim 1, the robot adapter further comprising a third linear motion device for translating the first and second end effectors along a horizontal axis, wherein the vertical linear motion device is a fourth linear motion device for translating the first and second end effectors along a vertical axis.

7. The substrate handling system of claim 1, the first and second end effectors each configured to engage a plurality of substrates.

8. A substrate handling system, comprising:
a robot adapter coupled to a robot;
first and second end effectors connected to opposite ends of the robot adapter, wherein a tool interface of the robot is coupled to a top surface of the robot adapter, between the first and second end effectors;
a vertical linear motion device of the robot adapter enabling vertical movement of the robot adaptor; and
a top entry load lock including opposing side walls, the top entry load lock coupled to a processing chamber;
wherein the robot adapter is centrally positioned directly over one of the opposing sidewalls, the robot adapter configured to move the first and second end effectors from a first position to a second position, the first position comprising a retracted position in which the first or second end effector is supported at a level above a top surface of one of the opposing sidewalls, and the second position comprising an extended position in which the first or second end effector is positionable within the top entry load lock to engage a plurality of substrates disposed in the top entry load lock.

9. The substrate handling system of claim 8, further comprising first and second linear motion devices coupled between the robot adapter and the first and second end effectors, respectively, the first and second linear motion devices being independently operable to selectively move the first and second end effectors into and out of the top entry load lock.

10. The substrate handling system of claim 9, the robot adapter further comprising a rotation feature for selectively rotating the first and second end effectors about a vertical axis extending through the robot adaptor.

11. The substrate handling system of claim 9, the robot adapter further comprising a third linear motion device for translating the first and second end effectors along a horizontal axis so that the first and second end effectors are selectively positionable over the top entry load lock.

12. The substrate handling system of claim 9, wherein the first and second linear motion devices each comprise a piston portion and a cylinder portion, wherein in the first position the piston portion is retracted within the cylinder portion and in the second position the piston portion is extended away from the cylinder portion.

13. The substrate handling system of claim 8, the robot adapter further comprising a third linear motion device for translating the first and second end effectors along a horizontal axis to selectively position the first and second end effectors over the top entry load lock, wherein the vertical linear motion device is a fourth linear motion device for translating the first and second end effectors along a vertical axis to selectively position the first and second end effectors into and out of the top entry load lock.

14. The substrate handling system of claim 8, the first and second end effectors each configured to engage a plurality of substrates.

\* \* \* \* \*